US010943752B2

(12) United States Patent
Hiramitsu et al.

(10) Patent No.: US 10,943,752 B2
(45) Date of Patent: Mar. 9, 2021

(54) RELAY COOLING DEVICE

(71) Applicants: AUTONETWORKS TECHNOLOGIES, LTD., Yokkaichi (JP); SUMITOMO WIRING SYSTEMS, LTD., Yokkaichi (JP); SUMITOMO ELECTRIC INDUSTRIES, LTD., Osaka (JP)

(72) Inventors: Hiroomi Hiramitsu, Yokkaichi (JP); Tomotaka Kurozu, Yokkaichi (JP)

(73) Assignees: AUTONETWORKS TECHNOLOGIES, LTD., Yokkaichi (JP); SUMITOMO WIRING SYSTEMS, LTD., Yokkaichi (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 569 days.

(21) Appl. No.: 15/772,434

(22) PCT Filed: Nov. 10, 2016

(86) PCT No.: PCT/JP2016/083320
§ 371 (c)(1),
(2) Date: Apr. 30, 2018

(87) PCT Pub. No.: WO2017/082331
PCT Pub. Date: May 18, 2017

(65) Prior Publication Data
US 2018/0330906 A1  Nov. 15, 2018

(30) Foreign Application Priority Data

Nov. 10, 2015 (JP) .............................. JP2015-220343

(51) Int. Cl.
*H01H 50/12* (2006.01)
*H01H 45/12* (2006.01)
*H05K 7/20* (2006.01)

(52) U.S. Cl.
CPC ............ *H01H 50/12* (2013.01); *H01H 45/12* (2013.01); *H05K 7/20236* (2013.01); *H05K 7/20272* (2013.01); *Y02T 10/62* (2013.01)

(58) Field of Classification Search
CPC .......... H05K 7/20236; H05K 7/20272; H01H 50/12; H01H 45/12; H01L 23/44; H01L 23/473
See application file for complete search history.

(56) References Cited

U.S. PATENT DOCUMENTS 7,852,178 B2 * 12/2010 Bush .................... H01H 50/023
   335/126
8,766,750 B2 * 7/2014 Choi .................... H01H 51/065
   335/185

(Continued)

FOREIGN PATENT DOCUMENTS

| JP | S4713808 Y | 5/1972 |
| JP | S5943047 U | 3/1984 |
| JP | H10144836 A | 5/1998 |

OTHER PUBLICATIONS

International Search Report for Application No. PCT/JP2016/083320 dated Jan. 31, 2017; 6 pages.

*Primary Examiner* — Zachary Pape
(74) *Attorney, Agent, or Firm* — Reising Ethington, P.C.

(57) ABSTRACT

A relay cooling device includes a container, a liquid coolant that is stored in the container, and a relay that is immersed in the liquid coolant.

6 Claims, 5 Drawing Sheets

(56) References Cited

U.S. PATENT DOCUMENTS

| | | | | |
|---|---|---|---|---|
| 9,512,361 B2* | 12/2016 | Nezu | .......................... | H01F 5/06 |
| 9,865,419 B2* | 1/2018 | Blackmon | .............. | H01H 9/043 |
| 2005/0072591 A1* | 4/2005 | Hayase | .................. | H01H 50/14 |
| | | | | 174/667 |
| 2014/0015119 A1 | 1/2014 | Bonkohara | | |
| 2018/0330906 A1* | 11/2018 | Hiramitsu | .............. | H01H 45/12 |
| 2020/0051765 A1* | 2/2020 | Hiramitsu | ................ | H02G 3/14 |

* cited by examiner

RELAY COOLING DEVICE

CROSS REFERENCE TO RELATED APPLICATIONS

This application claims the priority of Japanese patent application JP2015-220343 filed on Nov. 10, 2015, the entire contents of which are incorporated herein.

TECHNICAL FIELD

The technology disclosed in the present specification relates to technology for cooling a relay.

BACKGROUND ART

The relay disclosed in JP 2004-134140A is conventionally known. According to this relay, a relay unit is accommodated inside a case.

The relay unit includes a fixed contact, a movable member that has a movable contact that is capable of coming into contact with the fixed contact, a coil arranged so as to surround a core, and a spring that biases the movable member in a direction of moving away from a core.

SUMMARY

Recently, there has been demand for the ability to allow a relatively large current to flow through a relay that is connected to a battery in an electric automobile or a hybrid vehicle. In this case, there is concern that heat generated by electric conduction will result in a rise in the temperature inside the relay and the deterioration of an insulation layer of the coil.

According to Joule's law, the amount of heat Q generated by electric conduction over t seconds is proportional to the product of the resistance R of the conductor and the square of the current I ($Q=RI^2t$). Since the amount of generated heat increases according to the square of the current in this way, a problem occurs particularly when a relatively large current flows.

In order to reduce the amount of generated heat, it is conceivable to lower the resistance of the conductor. In order to lower the resistance of the conductor, it is conceivable to increase the cross-sectional area of the conductor. However, if the cross-sectional area of the conductor used in the relay is increased, the size of the relay increases, and therefore this is not practical. For this reason, there is desire for the ability to efficiently cool the relay when electricity is conducted.

The technology disclosed in the present specification was achieved in light of the foregoing circumstances, and an object thereof is to provide technology for improving relay cooling efficiency.

The technology disclosed in the present specification pertains to a relay cooling device that includes: a container; a liquid coolant stored in the container; and a relay immersed in the liquid coolant.

According to the above configuration, while current is flowing through the relay, heat generated by the relay is transmitted to the liquid coolant. Accordingly, it is possible to improve the relay cooling efficiency.

As a result, a rise in the temperature of the relay is suppressed. Accordingly, an excessive rise in the temperature of the relay can be suppressed without increasing the size of a part included in the relay, and therefore it is possible to suppress an increase in the size of the relay.

The following aspects are preferable as embodiments of the technology disclosed in the present specification.

It is preferable that the relay cooling device further includes a flow generation means that causes the liquid coolant in the container to flow.

According to the above configuration, the stagnation of relatively high-temperature liquid coolant in the periphery of the relay is suppressed. Accordingly, the temperature of the liquid coolant located in the vicinity of the relay can be reliably made lower than the temperature of the outer surface of the relay, thus making it possible to further improve the relay cooling efficiency.

It is preferable that a pipe through which the liquid coolant flows is connected to the container, and the flow generation means is a pump that is connected to the pipe.

According to the above configuration, the liquid coolant circulates in the container at all times, thus making it possible to further improve the efficiency of heat dissipation from the relay.

It is preferable that the relay has a relay unit, and a case in which the relay unit is accommodated, and a through-hole is formed in the case.

According to the above configuration, by providing the through-hole in the case, the liquid coolant flows into the case or is discharged from the case through the through-hole. Accordingly, the relay unit can be directly cooled by the liquid coolant, thus making it possible to further improve the relay cooling efficiency.

It is preferable that the relay unit has a fixed contact, a movable member that has a movable contact that is capable of coming into contact with the fixed contact, a coil arranged so as to surround a core, and a spring that biases the movable member in a direction of moving toward the fixed contact, the case has a coil housing chamber that accommodates the coil, and a contact housing chamber that is separated from the coil housing chamber by a dividing wall, and accommodates at least the fixed contact and the movable member, and the through-hole is provided in the coil housing chamber.

According to the above configuration, the coil and a core can be directly cooled by the liquid coolant, thus making it possible to further improve the relay cooling efficiency.

It is preferable that the relay unit has a fixed contact, a movable member that has a movable contact that is capable of coming into contact with the fixed contact, a coil arranged so as to surround a core, and a spring that biases the movable member in a direction of moving toward the fixed contact, the case has a coil housing chamber that accommodates the coil, and a contact housing chamber that is separated from the coil housing chamber by a dividing wall, and accommodates at least the fixed contact and the movable member, and the through-hole is provided in the contact housing chamber.

According to the above configuration, the fixed contact and the movable member can be directly cooled by the liquid coolant, thus making it possible to further improve the relay cooling efficiency.

It is preferable that the relay unit has a fixed contact, a movable member that has a movable contact that is capable of coming into contact with the fixed contact, a coil arranged so as to surround a core, and a spring that biases the movable member in a direction of moving toward the fixed contact, the case has a coil housing chamber that accommodates the coil, and a contact housing chamber that is separated from the coil housing chamber by a dividing wall, and accommodates the fixed contact, the movable member, and the spring, and the through-hole is provided in both the coil housing chamber and the contact housing chamber.

According to the above configuration, the coil and a core can be directly cooled by the liquid coolant, and the fixed contact and the movable member can also be directly cooled by the liquid coolant, thus making it possible to further improve the relay cooling efficiency.

It is preferable that the liquid coolant is electrically insulating.

According to the above configuration, the case is not required to be liquid-tight, thus making it possible to reduce the manufacturing cost of the relay.

According to the technology disclosed in the present specification, a relay can be cooled efficiently.

DESCRIPTION OF EMBODIMENTS

First Embodiment

Figure 1:
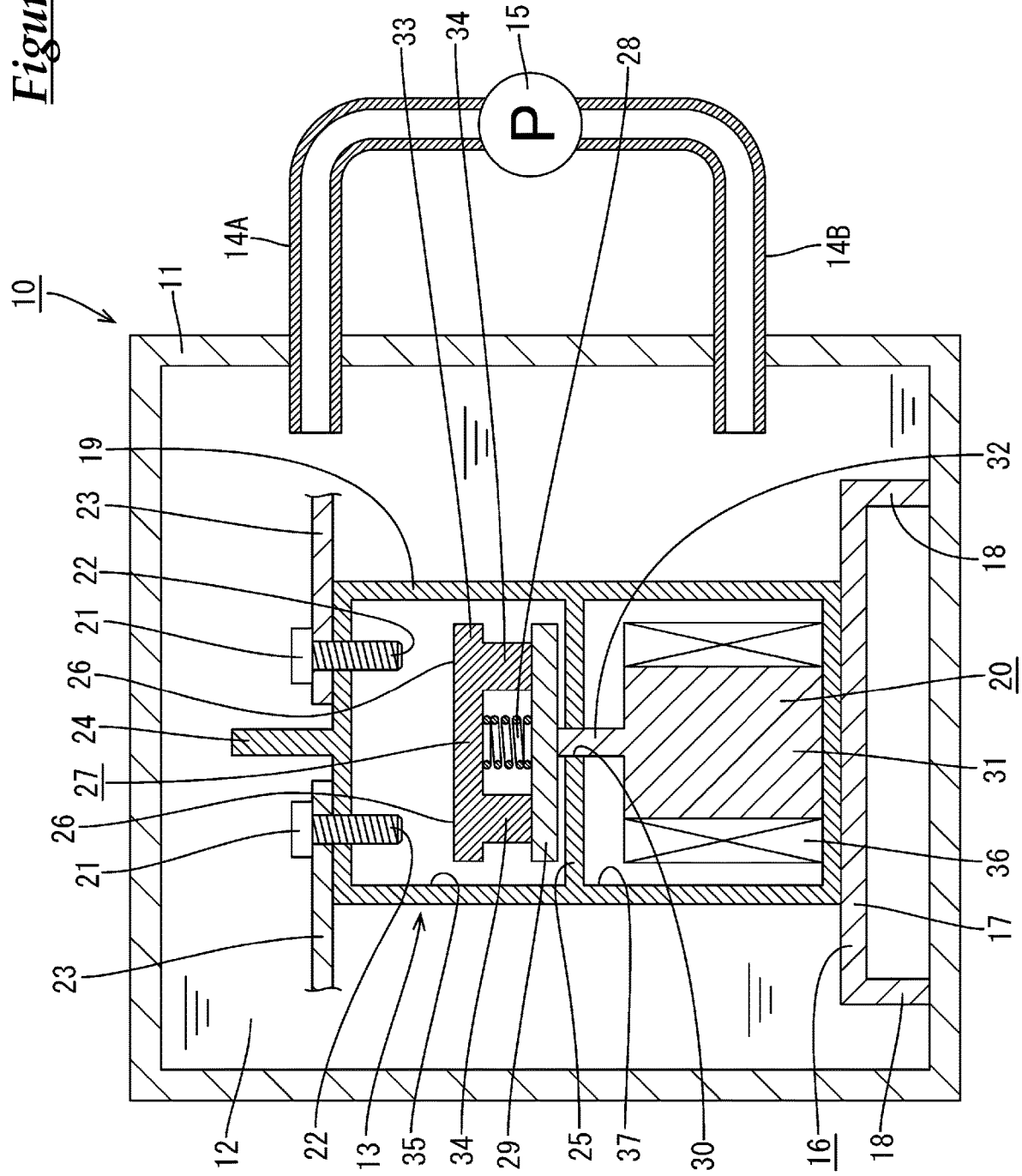
FIG. 1 is a schematic cross-sectional diagram showing a relay cooling device according to a first embodiment.

A first embodiment of technology disclosed in the present specification will be described below with reference to FIGS. 1 and 2. A relay cooling device 10 according to the present embodiment has a container 11, a liquid coolant 12 that is stored in the container 11, and a relay 13 that is immersed in the liquid coolant 12. Note that the terms upper and lower in the following description are respectively based on the upper side and the lower side in FIG. 1. Also, the terms right and left in the description are respectively based on the right side and the left side in FIG. 1.

The container 11 may be made of a metal, or may be made of a synthetic resin, and any material can be appropriately selected and used as necessary. The container 11 is sealed. The liquid coolant 12 is stored in the container 11. Two pipes 14A and 14B are attached to a side wall of the container 11 so as to be side-by-side in the vertical direction. A left end portion of the upper pipe 14A penetrates to the interior of the container 11. A right end portion of the pipe 14A is connected to a pump 15 (one example of a flow generation means). Also, a right end portion of the lower pipe 14B is connected to the pump 15, and a left end portion of the pipe 14B penetrates to the interior of the container 11. Accordingly, the liquid coolant 12 stored inside the container 11 is circulated by the pump 15 along the following path: container 11→pipe 14A→pump 15→pipe 14B→container 11. Accordingly, the liquid coolant 12 flows inside the container 11.

One example of a process for providing the liquid coolant 12 in the container 11 is a process in which an opening is provided in the top of the container 11, the liquid coolant 12 is injected into the container 11 through the opening, and then the opening is sealed. Note that the process for providing the liquid coolant 12 in the container 11 is not limited to the above-described process.

The liquid coolant 12 can be one or more materials selected from a perfluorocarbon, a hydrofluoroether, a hydrofluoroketone, a fluorine inert liquid, water, an alcohol such as methanol or ethanol, an oil such as silicone oil or mineral oil, and a hydrocarbon-based coolant. The liquid coolant 12 may be electrically insulating, or may be electrically conductive. In the present embodiment, an electrically insulating fluorine inert liquid can be preferably used as the liquid coolant 12.

The liquid coolant 12 does not need to completely fill the container 11, and the amount of liquid coolant 12 can be appropriately adjusted to an extent according to which the relay 13 is immersed.

A platform 16 for placement of the relay 13 is arranged on a bottom wall of the container 11. This platform 16 has a top plate 17 and leg portions 18. A space through which the liquid coolant 12 can flow is formed in the region under the top plate 17.

The relay 13 is substantially shaped as a rectangular parallelepiped. The relay 13 includes a case 19 and a relay unit 20 that is accommodated in the case 19.

The case 19 is provided with two fixed terminals 21 that pass through an upper wall of the case 19. Portions of the fixed terminals 21 that are located inside the case 19 serve as fixed contacts 22. Portions of the fixed terminals 21 that are located outside of the case 19 are respectively connected to bus bars 23. The bus bars 23 are connected to a power circuit that is not shown. A relatively large current flows through these bus bars 23.

A partition wall 24 that projects upward is provided on the upper wall of the case 19 at a location between the two fixed terminals 21. The two fixed terminals 21 are reliably insulated from each other by this partition wall 24.

The interior of the case 19 is partitioned into upper and lower portions by a dividing wall 25. The fixed contacts 22, a movable member 27 that has movable contacts 26 that are capable of coming into contact with the fixed contacts 22, a spring 28 that biases the movable member 27 in a direction of moving toward the fixed contacts 22, and a magnetic member 29 to which the spring 28 is attached are housed on the upper side inside the case 19. A through-hole 30 that penetrates in the up-down direction is formed in the dividing wall 25. A projecting shaft portion 32 of the later-described core 31 is inserted into this through-hole 30. The magnetic member 29 is attached to the projecting shaft portion 32 of a core 31.

The movable member 27 is formed by a material that is electrically conductive and is capable of adhering to the magnetic member 29 by magnetic force. Any material such as iron or an iron alloy can be appropriately selected as necessary as the metal that constitutes the movable member 27.

The movable member 27 has a contact plate portion 33 that is shaped as a plate that extends in the left-right direction, and leg portions 34 that project downward from positions toward the left and right end portions of the contact plate portion 33. Portions of the contact plate portion 33 that come into contact with the fixed contacts 22 serve as the movable contacts 26. The portion of the case 19 that is above the dividing wall 25 serves as a contact housing chamber 35 that accommodates the fixed contacts 22 and the movable member 27 that has the movable contacts 26.

The magnetic member 29 is shaped as a plate that extends in the left-right direction. In a view from above, the magnetic member 29 is formed with approximately the same size as the contact plate portion 33 of the movable member 27. The term "approximately the same size" may mean that the magnetic member 29 and the contact plate portion 33 of the movable member 27 are the same size, may mean that the magnetic member 29 is somewhat larger than the contact plate portion 33, or may mean that the magnetic member 29 is somewhat smaller than the contact plate portion 33.

The region of the case 19 that is below the dividing wall 25 serves as a coil housing chamber 37 that accommodates a coil 36.

The coil 36 is arranged so as to surround a core 31. The coil 36 has a known configuration in which an electrical wire having an insulating layer is wound into a coil. A core 31 is shaped so as to extend in the up-down direction. A core 31 is formed by a magnetic material, and can be formed by any magnetic material as necessary, such as iron or an iron alloy.

The projecting shaft portion 32 that projects upward is formed on an upper end portion of a core 31. The projecting shaft portion 32 is arranged so as to pass through the dividing wall 25 of the case 19 in the up-down direction. As described above, the magnetic member 29 is fixed to an upper end portion of the projecting shaft portion 32.

As shown in FIG. 1, when current is supplied to the coil 36, the movable member 27 is drawn toward the magnetic member 29 due to magnetic force generated in the coil 36 and a core 31. Accordingly, the electrical connection between the fixed contacts 22 and the movable contacts 26 is cut off. In this state, the spring 28 contracts in the up-down direction, and thus can exert repulsive force in the up-down direction.

Figure 2:
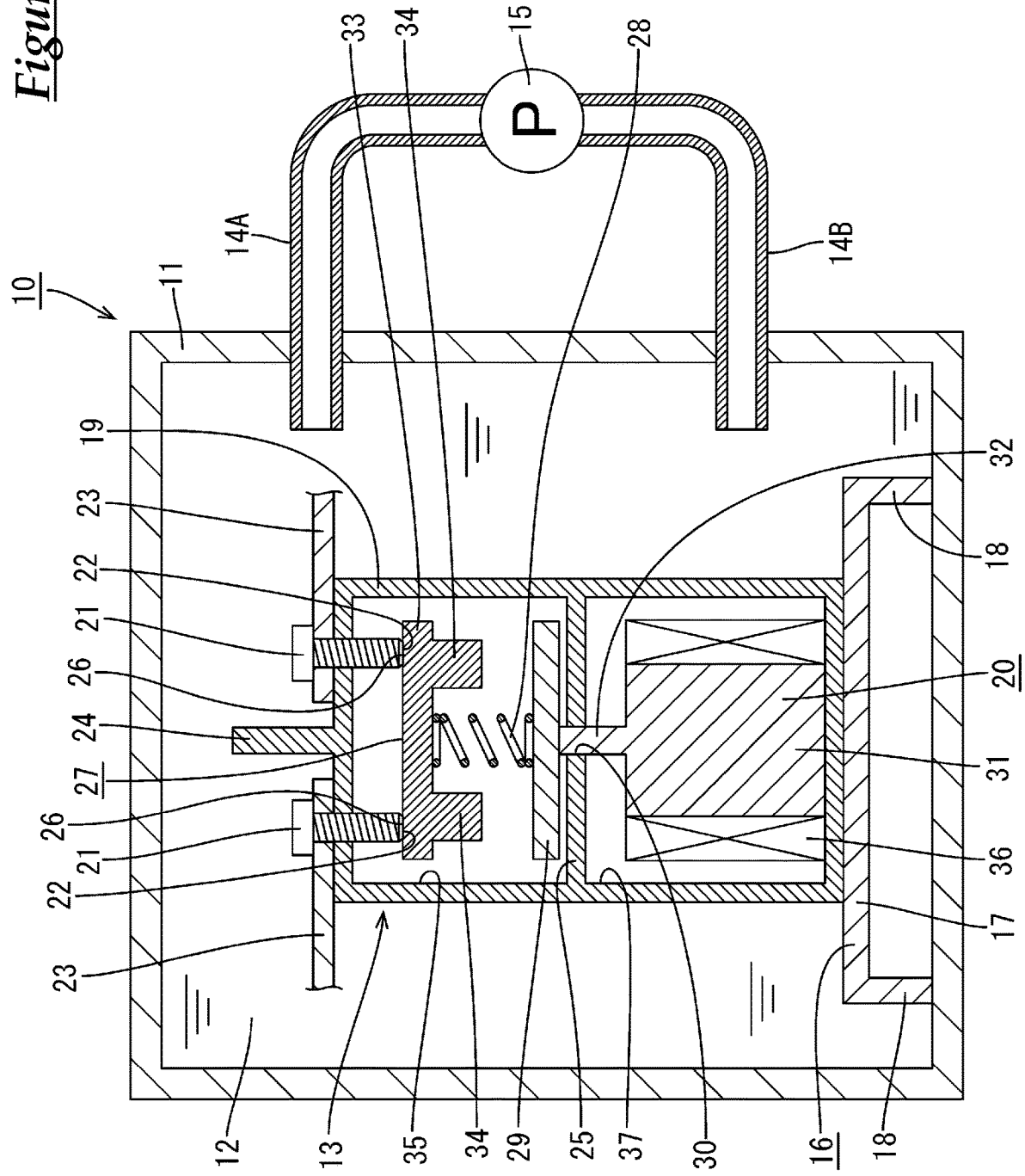
FIG. 2 is a schematic cross-sectional diagram showing the relay cooling device in a state where a relay is in a conduction state.

As shown in FIG. 2, when current is not supplied to the coil 36, the movable member 27 is biased upward by the spring 28, and comes into contact with the fixed contacts 22 from below. Accordingly, the two fixed contacts 22 are electrically connected to each other by the movable member 27 that has the movable contacts 26. As a result, current flows between the two bus bars 23. Note that a so-called coil spring, in which a metal wire is wound into the shape of the coil 36, is used as the spring 28 according to the present embodiment.

Actions and Effects of Embodiment

Next, actions and effects of the present embodiment will be described. According to the present embodiment, the relay cooling device 10 includes the container 11, the liquid coolant 12 that is stored in the container 11, and the relay 13 that is immersed in the liquid coolant 12. Accordingly, while current flows between the two bus bars 23, heat that is generated by the fixed contacts 22 and the movable member 27 is transmitted to the liquid coolant 12 via the wall portions of the case 19 and the fixed terminals 21 that project from the case 19. Accordingly, it is possible to improve the relay 13 cooling efficiency.

As a result, the accumulation of heat inside the case 19 is suppressed, thus suppressing a rise in the temperature inside the case 19. Accordingly, an excessive rise in the temperature inside the case 19 can be suppressed without increasing the size of the fixed terminals 21 and the movable member 27, and therefore it is possible to suppress an increase in the size of the relay 13.

Also, according to the present embodiment, a flow generation means that causes the liquid coolant 12 to flow inside the container 11 is provided, thus suppressing stagnation of relatively high-temperature liquid coolant 12 in the periphery of the relay 13. Accordingly, the temperature of the liquid coolant 12 located in the vicinity of the case 19 of the relay 13 can be reliably made lower than the temperature of the outer surface of the case 19 of the relay 13, thus making it possible to further improve the relay 13 cooling efficiency.

Also, according to the present embodiment, the pipes 14 through which the liquid coolant 12 flows are connected to the container 11, and the pump 15 is connected to the pipes 14. Accordingly, the liquid coolant 12 circulates in the container 11 at all times, thus making it possible to further improve the efficiency of heat dissipation from the relay 13.

Also, the liquid coolant 12 according to the present embodiment is electrically insulating. Accordingly, the case 19 of the relay 13 is not required to be liquid-tight, thus making it possible to lower the manufacturing cost of the relay 13.

Second Embodiment

Figure 3:
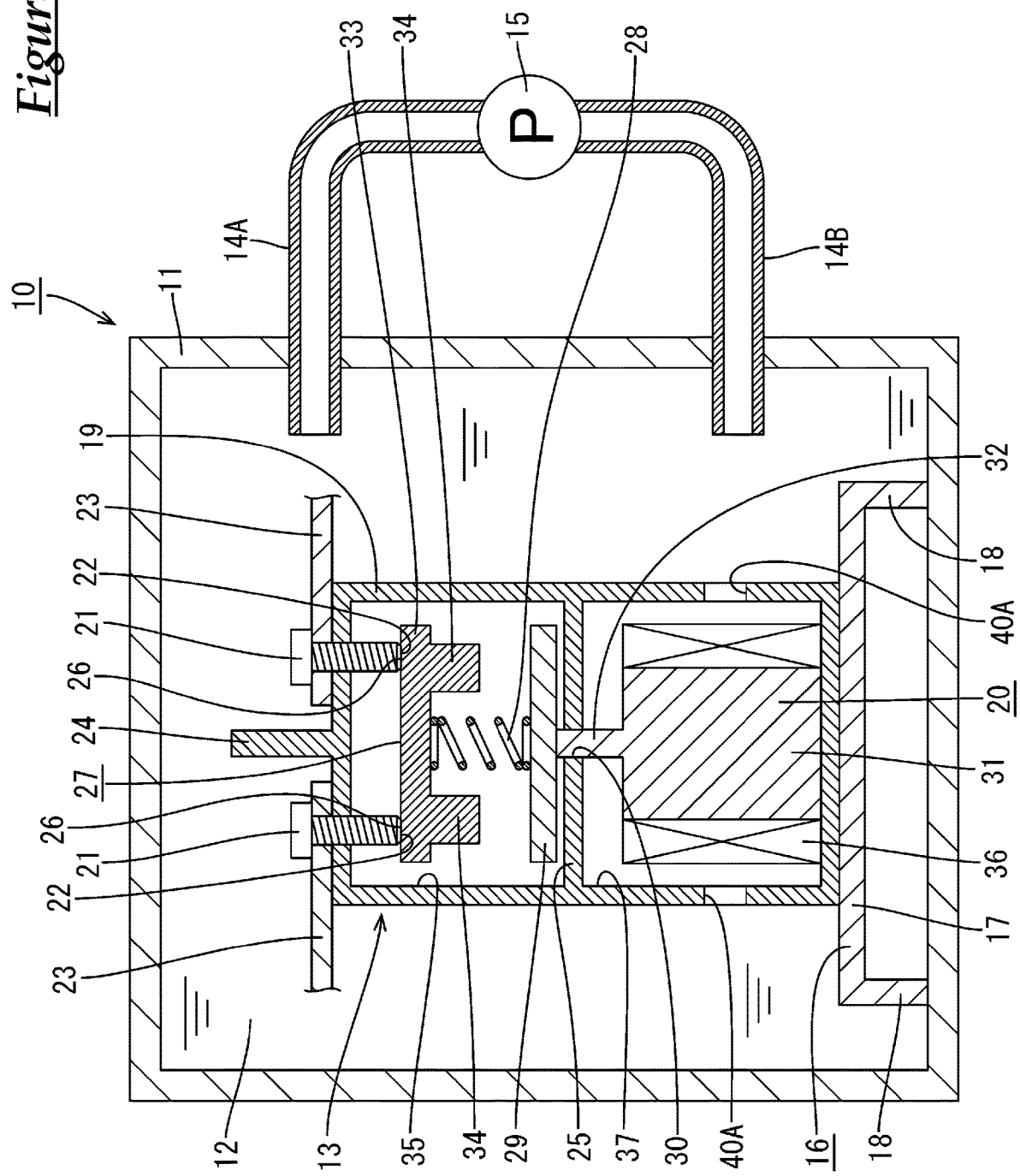
FIG. 3 is a schematic cross-sectional diagram showing a relay cooling device according to a second embodiment.

Next, a second embodiment of technology disclosed in the present specification will be described below with reference to FIG. 3. In the present embodiment, the case 19 of the relay 13 is provided with through-holes 40A in wall portions that constitute the coil housing chamber 37. In the present embodiment, the through-holes 40A are formed in the walls on the left and right sides in FIG. 3. Accordingly, the liquid coolant 12 flows into and out from the coil housing chamber 37.

Configurations other than those described above are substantially the same as in the first embodiment, and therefore like members are denoted by like reference signs, and redundant descriptions will not be given.

According to the above configuration, the liquid coolant 12 can come into direct contact with the coil 36 and a core 31. Accordingly, heat generated by the fixed terminals 21 and the movable member 27 is transmitted to a core 31 and the coil 36 via the magnetic member 29 and the projecting shaft portion 32, and thereafter is transmitted to the liquid coolant 12. In this way, the number of paths along which heat is transmitted to the liquid coolant 12 increases, thus making it possible to even more efficiently cool the coil 36.

Third Embodiment

Figure 4:
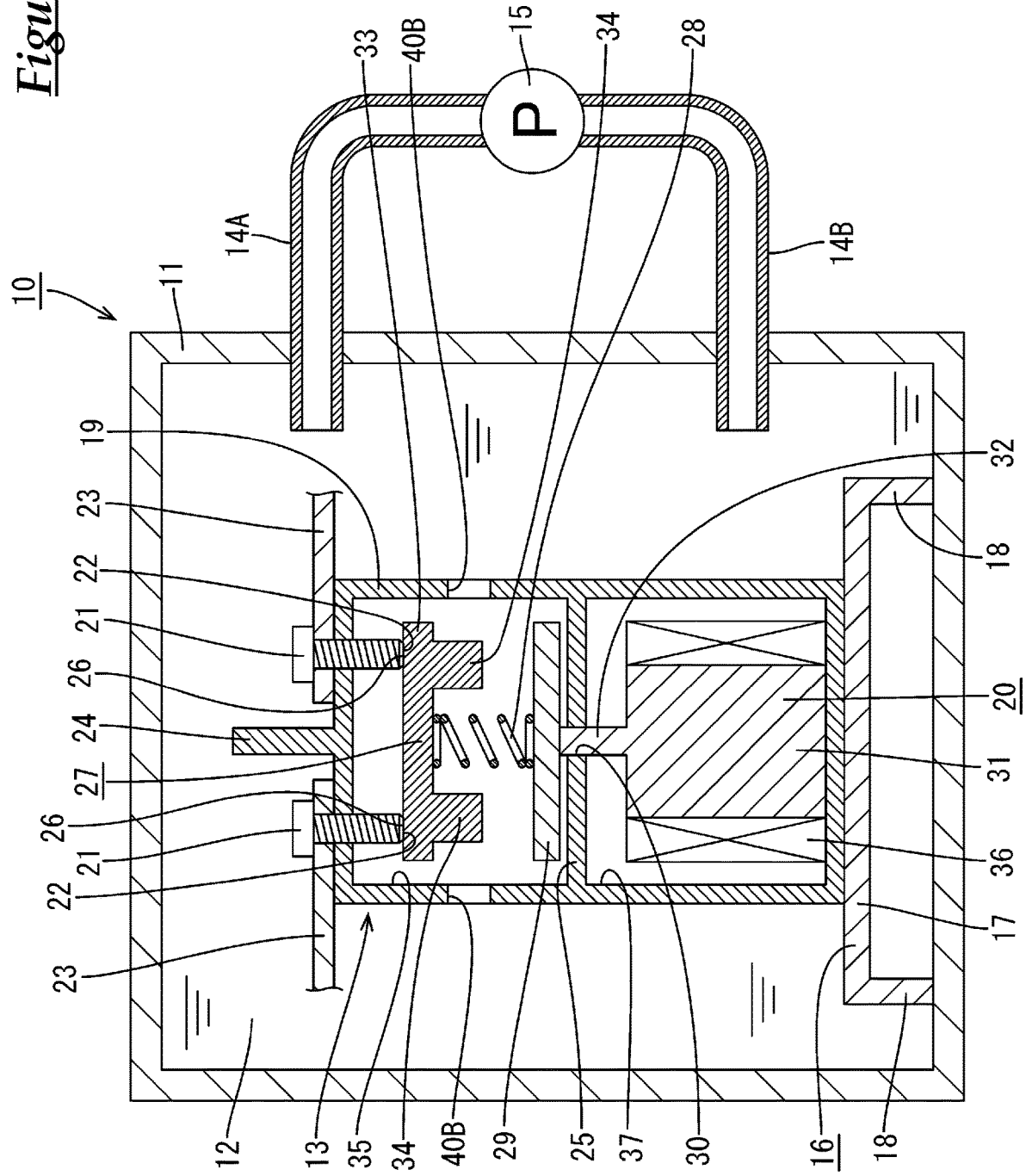
FIG. 4 is a schematic cross-sectional diagram showing a relay cooling device according to a third embodiment.

Next, a third embodiment of technology disclosed in the present specification will be described below with reference to FIG. 4. In the present embodiment, the case 19 of the relay 13 is provided with through-holes 40B in wall portions that constitute the contact housing chamber 35. In the present embodiment, the through-holes 40B are formed in the walls on the left and right sides in FIG. 4. Accordingly, the liquid coolant 12 flows into and out from the contact housing chamber 35.

Configurations other than those described above are substantially the same as in the first embodiment, and therefore like members are denoted by like reference signs, and redundant descriptions will not be given.

According to the above configuration, the liquid coolant 12 can come into direct contact with the fixed contacts 22 and the movable member 27. Accordingly, heat generated by the fixed terminals 21 and the movable member 27 is directly transmitted to the liquid coolant 12. As a result, it is possible to more efficiently cool the coil 36.

Fourth Embodiment

Figure 5:
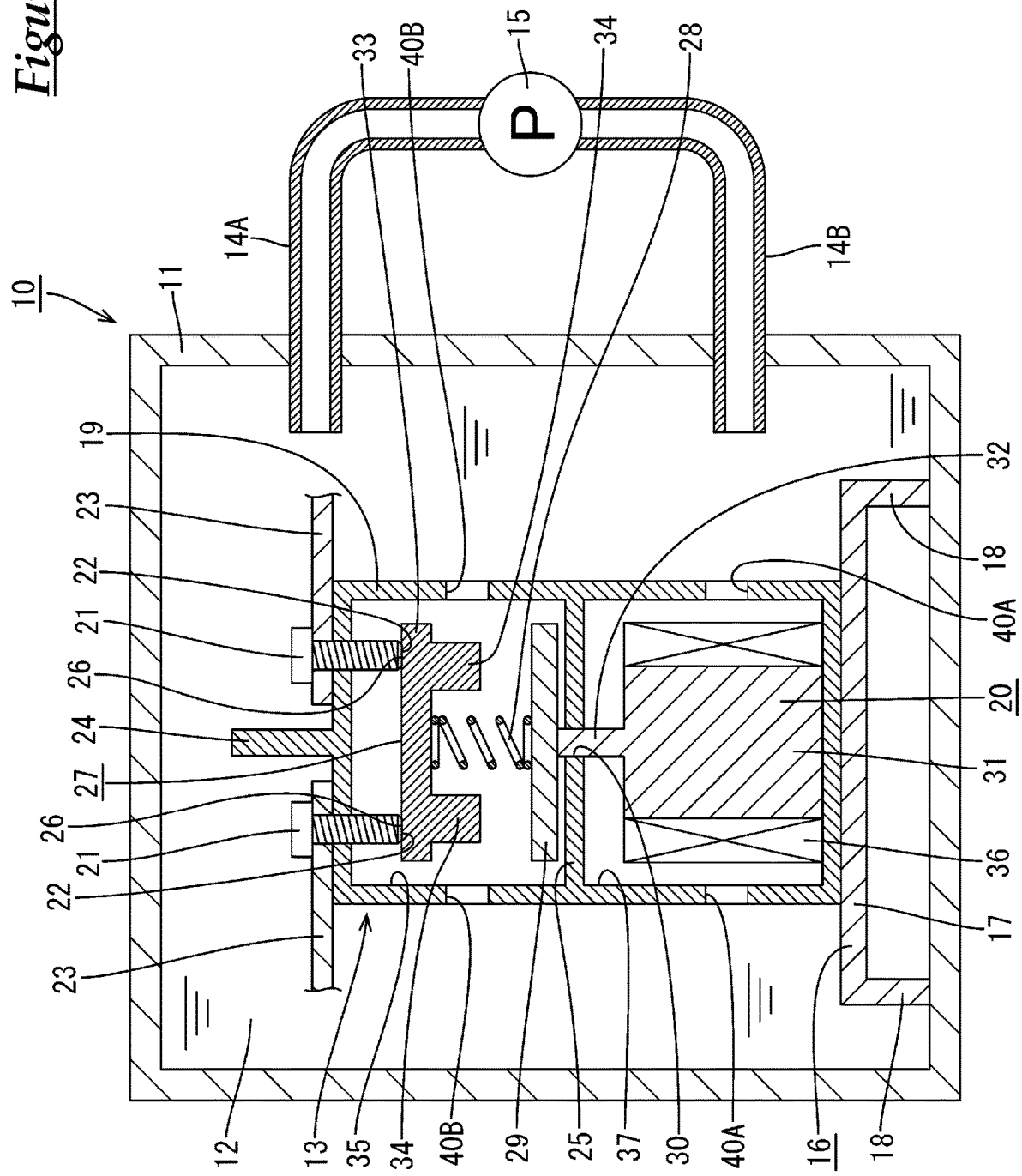
FIG. 5 is a schematic cross-sectional diagram showing a relay cooling device according to a fourth embodiment.

Next, a fourth embodiment of technology disclosed in the present specification will be described below with reference to FIG. 5. In the present embodiment, the case 19 of the relay 13 is provided with the through-holes 40B in wall portions that constitute the contact housing chamber 35, and is also provided with the through-holes 40A in wall portions that constitute the coil housing chamber 37. In the present embodiment, the through-holes 40A and 40B are formed in the walls on the left and right sides in FIG. 5. Accordingly, the liquid coolant 12 flows into and out from both the contact housing chamber 35 and the coil housing chamber 37.

Configurations other than those described above are substantially the same as in the first embodiment, and therefore like members are denoted by like reference signs, and redundant descriptions will not be given.

According to the above configuration, the liquid coolant 12 can come into direct contact with the fixed contacts 22, the movable member 27, the coil 36, and a core 31, which constitute the relay 13. Accordingly, it is possible to more efficiently cool the coil 36.

Other Embodiments

The technology disclosed in the present specification is not intended to be limited to the embodiments described using the above descriptions and drawings, and the technical scope of the technology disclosed in the present specification also encompasses various embodiments such as the following, for example.

The container 11 has a sealed configuration in the above embodiments, but is not required to be sealed.

Although the pump 15 is used as a flow generation means in the above embodiments, there is no limitation to this, and any flow generation means can be appropriately selected as necessary, such as an agitation device (e.g., a propeller) that is immersed in the liquid coolant 12 and agitates the liquid coolant.

Although the electrically insulating liquid coolant 12 is used in the above embodiments, there is no limitation to this, and an electrically conductive liquid coolant 12 may be used. In this case, it is desirable that the relay 13 has a liquid-tight sealed structure. A polar solvent such as water or alcohol can be used as the electrically conductive liquid coolant 12.

Although the coil is a coil-shaped spring 28 in the above embodiments, there is no limitation to this, and a spring having any shape can be used as necessary, such as a plate spring or a cone spring.

It is to be understood that the foregoing is a description of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "for example," "e.g.," "for instance," "such as," and "like," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

LIST OF REFERENCE NUMERALS

10 Relay cooling device
11 Container
12 Liquid coolant
13 Relay
14 Pipe
15 Pump
19 Case
20 Relay unit
22 Fixed contact
25 Dividing wall
26 Movable contact
27 Movable member
28 Spring
31 Core
35 Contact housing chamber
36 Coil
37 Coil housing chamber
40A, 40B Through-hole

The invention claimed is:

1. A relay cooling device comprising:
a container;
a liquid coolant stored in the container; and
a relay immersed in the liquid coolant,
wherein the relay has
a relay unit, and
a case in which the relay unit is accommodated,
the relay unit has
a fixed contact,
a movable member that has a movable contact that is capable of coming into contact with the fixed contact,
a coil arranged so as to surround a core, and
a spring that biases the movable member in a direction of moving toward the fixed contact,
the case has
a coil housing chamber that accommodates the coil, and
a contact housing chamber that is separated from the coil housing chamber by a dividing wall, and accommodates at least the fixed contact and the movable member, and
a through-hole is provided in the coil housing chamber.

2. The relay cooling device according to claim 1, further comprising a flow generation means that causes the liquid coolant in the container to flow.

3. The relay cooling device according to claim 2, wherein
a pipe through which the liquid coolant flows is connected to the container, and the flow generation means is a pump that is connected to the pipe.

4. The relay cooling device according to claim 2, wherein
the liquid coolant is electrically insulating.

5. A relay cooling device comprising:
a container;
a liquid coolant stored in the container; and
a relay immersed in the liquid coolant,
wherein the relay has
a relay unit, and
a case in which the relay unit is accommodated,
the relay unit has
a fixed contact, a movable member that has a movable contact that is capable of coming into contact with the fixed contact,
a coil arranged so as to surround a core, and
a spring that biases the movable member in a direction of moving toward the fixed contact,
the case has
a coil housing chamber that accommodates the coil, and
a contact housing chamber that is separated from the coil housing chamber by a dividing wall, and accommodates at least the fixed contact and the movable member, and
a through-hole is provided in the contact housing chamber.

6. A relay cooling device comprising:
a container;
a liquid coolant stored in the container; and
a relay immersed in the liquid coolant,
wherein the relay has
a relay unit, and
a case in which the relay unit is accommodated,
the relay unit has
a fixed contact,
a movable member that has a movable contact that is capable of coming into contact with the fixed contact,
a coil arranged so as to surround a core, and
a spring that biases the movable member in a direction of moving toward the fixed contact,
the case has
a coil housing chamber that accommodates the coil, and
a contact housing chamber that is separated from the coil housing chamber by a dividing wall, and accommodates at least the fixed contact and the movable member, and
a through-hole is provided in both the coil housing chamber and the contact housing chamber.

* * * * *